United States Patent [19]

Gurrie et al.

[11] Patent Number: 5,296,651

[45] Date of Patent: Mar. 22, 1994

[54] FLEXIBLE CIRCUIT WITH GROUND PLANE

[75] Inventors: Francis E. Gurrie, Ipswich; Wojtek Sudol, Burlington, both of Mass.

[73] Assignee: Hewlett-Packard Company, Palo Alto, Calif.

[21] Appl. No.: 14,973

[22] Filed: Feb. 9, 1993

[51] Int. Cl.$^5$ .............................. H05K 1/00
[52] U.S. Cl. ..................... 174/254; 174/255; 174/250; 428/901; 361/749
[58] Field of Search ............ 174/250, 254, 255, 261, 174/262; 361/749; 428/901

[56] References Cited

U.S. PATENT DOCUMENTS

| | | | |
|---|---|---|---|
| 4,311,749 | 1/1982 | Hiraiwa et al. | 428/209 |
| 4,323,726 | 4/1982 | Criss et al. | |
| 4,694,123 | 9/1987 | Massey | 174/117 |
| 4,779,340 | 10/1988 | Kihm et al. | |
| 4,854,038 | 8/1989 | Wiley | |
| 4,881,901 | 11/1989 | Mendenhall et al. | 439/65 |
| 4,895,523 | 1/1990 | Morrison et al. | 439/67 |
| 4,902,236 | 2/1990 | Hasircoglu | 439/77 |
| 4,979,787 | 12/1990 | Lichtenberger | 350/96.2 |
| 4,997,517 | 3/1991 | Parthasarathi | 156/630 |
| 5,004,639 | 4/1991 | Desai | 428/138 |
| 5,030,931 | 7/1991 | Brooks et al. | 333/161 |
| 5,036,379 | 7/1991 | Smith et al. | 357/69 |
| 5,072,074 | 12/1991 | DeMaso et al. | 174/254 |
| 5,072,520 | 12/1991 | Nelson | 29/852 |

FOREIGN PATENT DOCUMENTS 529739  2/1993  Japan ..................... 174/254

Primary Examiner—Leo P. Picard
Assistant Examiner—L. Thomas

[57] ABSTRACT

A flexible circuit suitable for high density applications and having a long flexural life is disclosed. A thin film metallic ground plane deposited on a dielectric substrate electrically shields the conductor traces in the flexible circuit and eliminates cross-talk between conductor traces without reducing the flexibility or the flexural life of the flexible circuit.

7 Claims, 2 Drawing Sheets

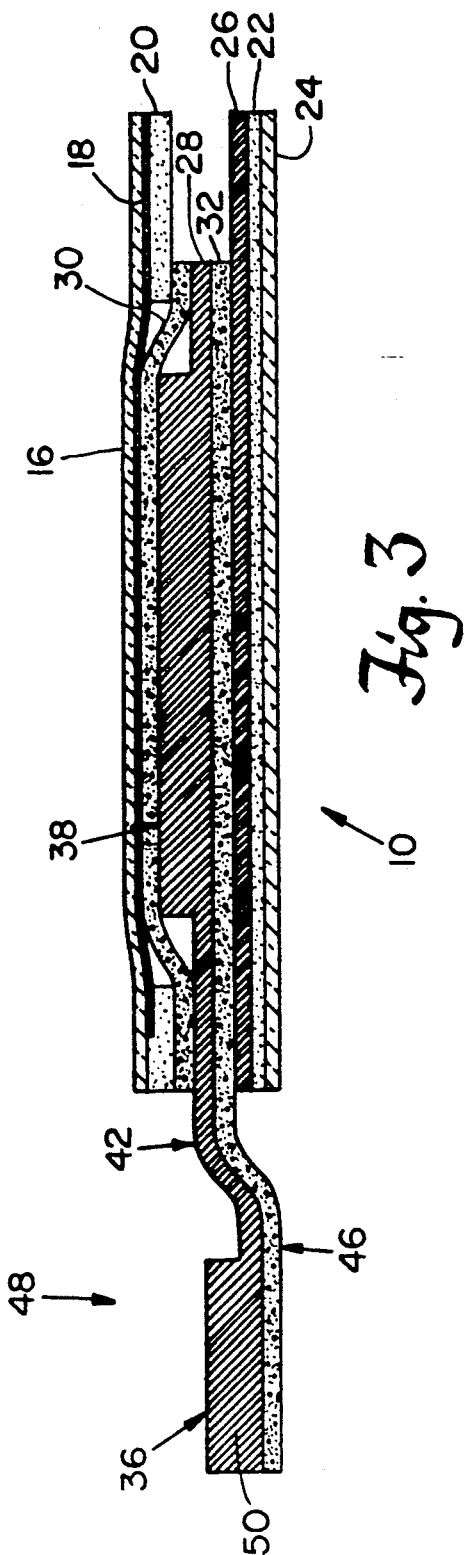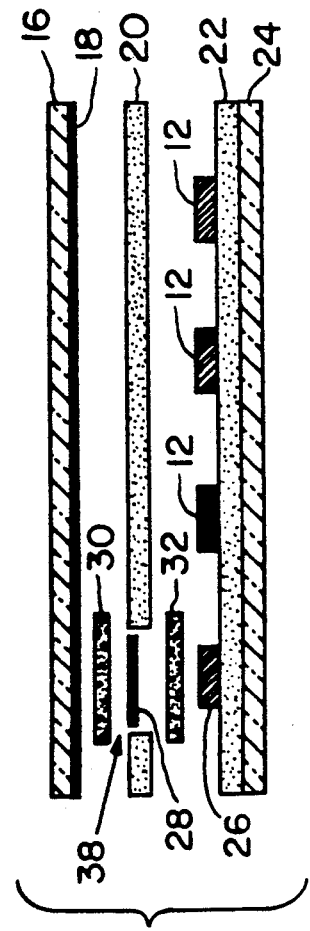

FLEXIBLE CIRCUIT WITH GROUND PLANE

BACKGROUND OF THE INVENTION

Flexible circuits, also known as flex circuits, are widely used in applications where electrical connections are required to withstand a large number of bending cycles. A typical flex circuit contains multiple conductor traces carrying electrical signals. Conductor traces are sandwiched between two flat insulating dielectric layers. A symmetrical construction of the flexible circuit is preferred for obtaining a long flex life. The flex life of a flex circuit is the number of times the circuit can flex before failing. In a symmetrical design, the conductor traces are located on the center or neutral axis of the flexible circuit and thus encounter bending strains close to zero.

In high frequency signal applications, the close proximity of conductor traces to each other causes an electromagnetic effect known as cross-talk to occur. In cross-talk, an electric field is generated around a conductor trace which interferes with neighboring conductor traces. One solution for eliminating cross-talk is to separate the signal conductor traces with traces connected to an electrical ground. This solution is not suitable in high density applications because the number of traces is doubled, thus doubling the width of the flex circuit.

Another solution for eliminating cross-talk is by mounting a plane of conductive material connected to an electric ground in close proximity to the conductor traces. The addition of the ground plane also requires an additional layer of adhesive for bonding the ground plane. The additional layers of adhesive and the ground conductor increase the thickness of the flex circuit and move the neutral axis of the circuit away from the centerline of the conductive traces. The conductive traces are thus subjected to higher strains. This reduces the flex life of the conductor traces and the circuit. Additionally, the increased thickness of the flex circuit also reduces the flexibility of the circuit.

Accordingly, there is a continuing need for an electrically grounded flex circuit having a long flex life that is also suitable for high density applications.

SUMMARY OF THE INVENTION

The present invention provides a planar flexible circuit having conductor traces positioned along a center plane or neutral axis of the flex circuit. The positioning of the conductor traces along the neutral axis gives the flexible circuit a long flex life. In the preferred embodiment, first and second dielectric layers for insulating the conductor traces are on opposite sides of the center plane and are joined to each other and to the conductor traces with an adhesive. A thin film metallic planar conductor is formed on at least one of the dielectric layers on the surface facing the conductor traces and separated from the conductor traces by the adhesive. The planar conductor is formed with a pattern of holes through which the adhesive bonds directly to the dielectric layer. The planar conductor electrically shields the conductor traces and eliminates cross-talk between the conductor traces without reducing the flexibility or flex life of the flexible circuit. Additionally, the planar conductor does not substantially increase the width or thickness of the flex circuit making the present invention suitable for high density applications.

In accordance with another aspect of the present invention a conductive adhesive is applied in a limited region between the planar conductor, a conductive tab and a conductive trace for electrically connecting those components together. The conductive tab provides a region to which external electrical connections are made.

BRIEF DESCRIPTION OF THE DRAWINGS

The foregoing and other objects, features and advantages of the invention will be apparent from the following more particular description of the preferred embodiments of the drawings in like reference characters refer to the same parts throughout the different views. Drawings are not necessarily to scale, emphasis instead being placed upon illustrating the principles of the invention.

FIG. 3 is a sectional view of the conductive tab region of the present invention flex circuit.

FIG. 4 is an exploded sectional view of the components of the present invention flex circuit.

DETAILED DESCRIPTION OF THE PREFERRED EMBODIMENT

Figure 1A:
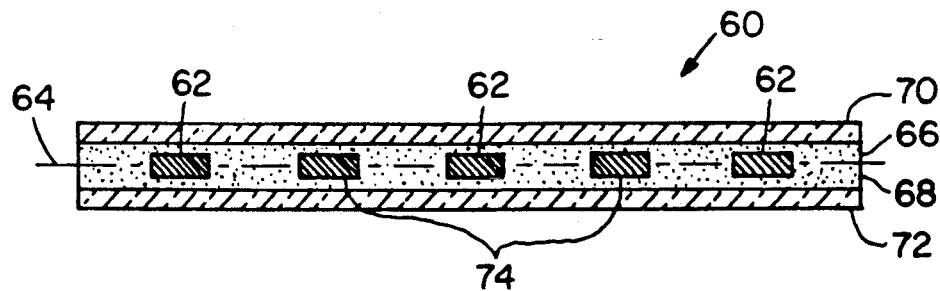
FIG. 1a is a sectional view of a prior art flex circuit grounded with ground traces.
Figure 1B:
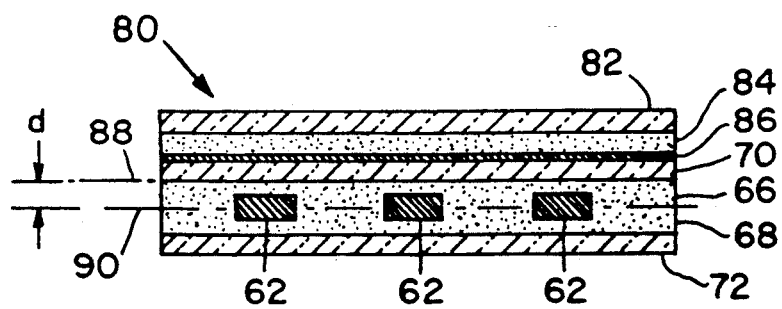
FIG. 1b is a sectional view of a prior art flex circuit grounded with a ground plane and having additional adhesive and dielectric layers.

FIGS. 1a and 1b depict two prior art flex circuits which are electrically shielded for eliminating cross-talk.

In FIG. 1a, conductor traces 62 are separated by ground traces 74 and are centered on neutral axis 64 of prior art flex circuit 60. Ground traces 74 are connected to an electrical ground and eliminate cross-talk between conductor traces 62 by electrically shielding conductor traces 62 from each other. Neutral axis 64 is the central axis of flex circuit 60. Stresses exerted on conductor traces 62 and ground traces 74 caused by the bending of flex circuit 60 are minimal along neutral axis 64 so that flex circuit 60 experiences a long flex life. Adhesive layers 66 and 68 bond dielectric substrates 70 and 72. Dielectric substrates serve to insulate flex circuit 60. Although flex circuit 60 experiences a long flex life, flex circuit 60 is not suitable for high density applications because the addition of ground traces 74 doubles the total number of traces, thus doubling the width of the flex circuit.

The prior art flex circuit 80 depicted in FIG. 1b differs from prior art flex circuit 60 (FIG. 1a) in that ground plane 86, adhesive layer 84 and dielectric substrate 82 are laminated over dielectric substrate 70 instead of adding ground traces 74. Ground plane 86 eliminates cross-talk between conductor traces 62 by electrically shielding conductor traces 62 without doubling the width of flex circuit 80. Therefore, flex circuit 80 is suitable for high density applications. However, an additional dielectric substrate 82 is required to insulate the ground plane 86. Dielectric substrate 82 is bonded to ground plane 86 with an additional adhesive layer 84. The increase in thickness of flex circuit 80 caused by the addition of ground plane 86, adhesive layer 84 and dielectric substrate 82 offsets the centerline 90 of conductor traces 62 away from the neutral axis 88 of flex circuit 80 by a distance "d". The offset "d" causes conductor traces 62 to be subjected to higher strains when flex circuit 80 is subjected to bending, reducing the flex life of conductor traces 62. Additionally the increased thickness of flex circuit 80 reduces the flexibility of flex circuit 80.

The present invention flex circuit overcomes the limitations of the prior art and provides a flex circuit suitable for high density applications which also has a long flex life.

Figure 2A:
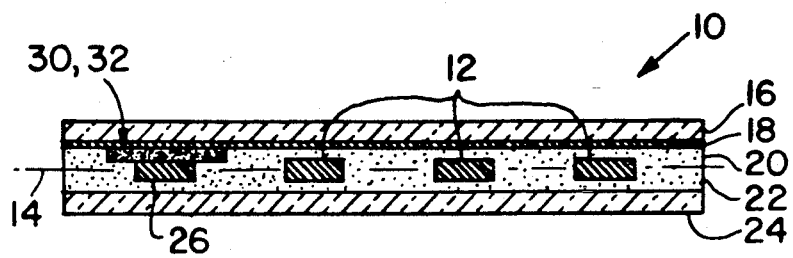
FIG. 2a is a sectional view of the present invention flex circuit.

In FIG. 2a, conductor traces 12 of a preferred embodiment of the present invention are centered on neutral axis 14 of flex circuit 10. Neutral axis 14 is the central axis of flexible circuit 10. Stresses exerted on conductor traces 12 caused by the bending of flex circuit 10 are minimal along neutral axis 14 so that conductor traces 12 experience a long flex life. The number of conductor traces 12 employed varies depending upon the application in which flex circuit 10 is used. Adhesive layers 20 and 22 bond conductor traces 12 between dielectric substrates 16 and 24. Dielectric substrates 16 and 24 are made of Kapton ™ and serve to insulate flexible circuit 10.

Figure 2B:
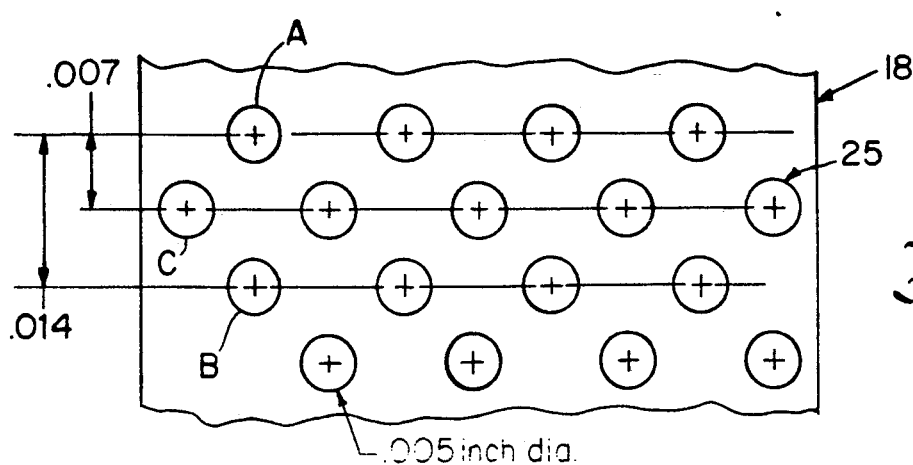
FIG. 2b is a partial plan view of the pattern of holes in the ground plane.

Ground plane 18 is preferably a sputtered copper film 5000 Angstrom thick deposited on substrate 16 which faces and electrically shields conductor traces 12. Ground plane 18, being a thin film does not add substantially to the thickness of flex circuit 10. Therefore, conductor traces 12 remain centered along neutral axis 14. A pattern of 0.005 inch diameter holes 25 are formed in ground plane 18 as depicted in FIG. 2b. The holes 25 are positioned so that each horizontal row of holes is spaced 0.007 inches apart from each adjacent row (for example rows A and C). The position of holes 25 in adjacent rows are offset. Rows of holes 25 which are two rows apart such as rows A and B are spaced 0.014 inches apart and the holes 25 are not offset. Holes 25 allow adhesive layer 20 to pass through the holes 25 and adhere directly to dielectric substrate 16. Holes 25 may also add to the flex life of ground plane 18 by adding flexibility. In the alternative, ground plane 18 can be of other thicknesses, preferably under 10,000 Angstroms thick, and can be made of other conductive metals such as gold or aluminum and may be applied by other than film processes. Furthermore, the size and spacing of holes 25 can be varied and may in some cases be omitted.

The electrical shielding of conductor traces 12 eliminates cross-talk between the traces 12. Adhesive layer 20 sufficiently insulates conductor traces 12 from ground plane 18 and prevents flex circuit 10 from short circuiting. In the preferred embodiment, the gap between conductive traces 12 and ground plane 18 is about 1 mil ($10^{-3}$ inches).

Conductive adhesive layers 30 and 32 electrically connect ground trace 26 to ground plane 18 and allow external electrical connections to be made to ground plane 18 through ground trace 26. Ground trace 26 is centered along the neutral axis 14 and is adjacent to conductor traces 12.

FIG. 3 depicts a preferred method for providing an external electrical connection to ground plane 18 and ground trace 26. Conductive adhesive layers 30 and 32 bond and electrically connect conductor tab 28 to ground plane 18 and ground trace 26 respectively. In the preferred embodiment, conductor tab 28 is copper but can alternatively be made of other conductive metals. Conductive adhesive layers 30 and 32 are die cut adhesive sheets containing solder balls known under the trademark as Z-Link ™. Conductive adhesive layer 30 electrically connects conductor tab 28 to ground plane 18 in a region 38 unoccupied by adhesive layer 20. Conductive adhesive layer 32 covers the bottom surface 46 of conducting tab 28 and electrically connects conductor tab 28 to ground trace 26 along the mating surfaces of conductor tab 28 and ground trace 26. Conductor tab 28 has an external finger 48 which extends from flex circuit 10 and allows external electrical connections to be made to ground plane 18 and ground trace 26. A thinned portion 42 provides external finger 48 with flexibility so that finger 48 can be bent. A thickened portion 36 forms a connecting surface and allows solder connections to be made to conductor tab 28. In the preferred embodiment, electrical connections are made to the side of thickened portion 36 on surface 50. Alternatively, electrical connections can be made to any of the other surfaces of thickened portion 36.

The method of making the preferred embodiment of the present invention flex circuit 10 which includes conductor tab 28 is depicted in FIG. 4. A 2 mil thick adhesive sheet is applied to dielectric substrate 24 forming adhesive layer 22. Alternatively, adhesive may be coated onto dielectric substrate 24 to form adhesive layer 22. Conductor traces 12 are etched on top of adhesive layer 22 by an etching process.

Conductive adhesive layer 32 is applied to the bottom of conductor tab 28. Conductor tab 28 is then laid over ground trace 26. A second 2 mil sheet of adhesive forming adhesive layer 20 is applied over conductor traces 12. Adhesive layer 20 has a region 38 centered over conductor tab 28 in which adhesive has been removed. Conductive adhesive layer 30 is laid over conductor tab 28 and region 38. A thin film of copper is sputtered onto the surface of substrate 16 to form ground plane 18. The deposited layer of copper is approximately 5,000 angstroms thick and has the pattern of holes depicted in FIG. 2b. Dielectric substrate 16 is then applied over adhesive layer 20 with ground plane 18 facing adhesive layer 20.

The flex circuit 10 is then laminated together under heat and pressure causing adhesive layers 20 and 22 to flow around conductor traces 12 and bonding the components of flexible circuit 10 together. The holes 25 in ground plane 18 (FIG. 2b) allow adhesive to flow through the holes 25 and to bond directly to dielectric substrate 16 to provide a stable bond. The solder balls in conductive adhesive layers 30 and 32 melt and flow thereby providing an electrical connection between ground plane 18, conductor tab 28 and ground trace 26. Alternatively, conductor tab 28 can be coated with solder which will melt and flow during the lamination process to form the electrical connection between ground plane 18, conductor tab 28 and ground trace 26.

EQUIVALENTS

While this invention has been particularly shown and described with references to preferred embodiments thereof, it will be understood by those skilled in the art that various changes in form and details may be made therein without departing from the spirit and scope of the invention as defined by the appended claims.

We claim:
1. A planar flex circuit comprising:
   conductor traces at approximately a center plane of the flex circuit;

first and second dielectric layers on opposite sides of the center plane joined to each other and to the conductor traces through adhesive; and a planar conductor formed on at least one of the dielectric layers on a surface facing the conductor traces and separated from the conductor traces by the adhesive.

2. A planar flex circuit as claimed in claim 1 wherein the planar conductor is vapor deposited on the dielectric layer.

3. A planar flex circuit as claimed in claim 2 further comprising holes in the planar conductor through which adhesive adheres to the dielectric layer.

4. A planar flex circuit as claimed in claim 1 further comprising holes in the planar conductor through which adhesive adheres to the dielectric layer.

5. A planar flex circuit as claimed in claim 1 further comprising a conductive adhesive in a limited region between the planar conductor and a conductive trace to electrically connect the planar conductor and the conductor trace.

6. A planar flex circuit as claimed in claim 5 further comprising a conductive tab joined between the planar conductor and conductor trace by the conductive adhesive.

7. A planar circuit as claimed in claim 1 wherein the planar conductor is less than 10,000 angstroms thick.

* * * * *